(12) United States Patent
Fuhrmann et al.

(10) Patent No.: US 9,679,702 B2
(45) Date of Patent: Jun. 13, 2017

(54) DYE COMPRISING A CHROMOPHORE TO WHICH AN ACYLOIN GROUP IS ATTACHED

(71) Applicant: SONY CORPORATION, Tokyo (JP)

(72) Inventors: Gerda Fuhrmann, Stuttgart (DE);
Gabriele Nelles, Stuttgart (DE);
Ameneh Bamedi Zilai, Stuttgart (DE);
Markus Obermaier, Stuttgart (DE)

(73) Assignee: SONY CORPORATION, Tokyo (JP)

(*) Notice: Subject to any disclaimer, the term of this patent is extended or adjusted under 35 U.S.C. 154(b) by 176 days.

(21) Appl. No.: 14/256,458

(22) Filed: Apr. 18, 2014

(65) Prior Publication Data

US 2014/0224330 A1    Aug. 14, 2014

Related U.S. Application Data

(62) Division of application No. 13/123,344, filed as application No. PCT/EP2009/006888 on Sep. 23, 2009, now abandoned.

(30) Foreign Application Priority Data

Oct. 27, 2008 (EP) .................................. 08018743
Jun. 22, 2009 (EP) .................................. 09008155

(51) Int. Cl.
| | |
|---|---|
| H01G 9/20 | (2006.01) |
| C09B 47/08 | (2006.01) |
| C09B 57/00 | (2006.01) |
| C09B 57/10 | (2006.01) |
| C09B 62/78 | (2006.01) |
| H01L 51/00 | (2006.01) |

(52) U.S. Cl.
CPC ........... *H01G 9/2059* (2013.01); *C09B 47/08* (2013.01); *C09B 57/00* (2013.01); *C09B 57/007* (2013.01); *C09B 57/10* (2013.01); *C09B 62/78* (2013.01); *H01G 9/2031* (2013.01); *H01L 51/0064* (2013.01); *H01L 51/0086* (2013.01); *Y02E 10/542* (2013.01); *Y02P 70/521* (2015.11)

(58) Field of Classification Search
CPC ..... Y02E 10/542; C09B 57/00; C09B 57/007; H01G 9/2059

See application file for complete search history.

(56) References Cited

U.S. PATENT DOCUMENTS

| | | | |
|---|---|---|---|
| 6,335,481 B1 | 1/2002 | Watanabe | |
| 2010/0212737 A1 | 8/2010 | Fuhrmann et al. | |
| 2010/0300521 A1 | 12/2010 | Fuhrmann et al. | |

FOREIGN PATENT DOCUMENTS

| | | | | |
|---|---|---|---|---|
| CN | 101151331 A | 3/2008 | | |
| EP | 0 991 092 | 4/2000 | | |
| EP | 1 176 618 | 1/2002 | | |
| EP | 1 867 682 | 12/2007 | | |
| IT | WO 0210286 A2 * | 2/2002 | ........... | C07F 15/0053 |
| JP | EP 1176618 A1 * | 1/2002 | ........... | C07D 213/22 |
| JP | 2002-324589 A | 11/2002 | | |
| JP | 2004 296170 | 10/2004 | | |
| JP | 2006134649 A * | 5/2006 | | |
| WO | 2005 122320 | 12/2005 | | |

OTHER PUBLICATIONS

Machine translation of WO 2005/122320, 2005.*
Machine translation of JP 2006134649 A, 2006.*
Combined Chinese Office Action and Search Report issued Jul. 9, 2014 in Patent Application No. 200980142891l(with English language translation).
Office Action issued Apr. 7, 2014 in European Patent Application No. 09 778 687.5.
International Search Report issued Aug. 24, 2010 in PCT/EP09/06888 filed Sep. 23, 2009.
Kim, Sung-Hoon et al., "High performance squarylium dyes for high-tech use", Coloration Technology Society of Dyers and Colourists, vol. 117, No. 2, pp. 61-67, XP001058498, ISSN: 1472-3581, (Jan. 1, 2001).
Yum, Jun-Ho et al., "Efficient Far Red Sensitization of Nanocrystalline $TiO_2$ Films by an Unsymmetrical Squarine Dye", J., Am., Chem., Soc., vol. 129, pp. 10320-10321, XP002579984, (2007).
Yagi, Shigeyuki et al., "Synthesis of novel unsymmetrical squarylium dyes absorbing in the near-infrared region", J., Chem., Soc., Perkin Trans. I, pp. 599-603, XP002579985, (2000).
Meier, Herbert et al., "Bis (stilbenyl)squaraines—Novel Pigments with Extended Conjugation", Tetrahedron Letters, vol. 37, No. 8, pp. 1191-1194, XP002579986, (1996).
Chinese Office Action issued Dec. 24, 2012, in China Patent Application No. 200980142891.1 (with English translation).
Combined Chinese Office Action and Search Report issued Jan. 23, 2014 in Patent Application No. 200980142891.1 (with partial English language translation).

* cited by examiner

*Primary Examiner* — Wenwen Cai
(74) *Attorney, Agent, or Firm* — Oblon, McClelland, Maier & Neustadt, L.L.P.

(57) ABSTRACT

The present invention related to a dye comprising a chromophore to which an acyloin group as anchoring group is attached, to a method of synthesis of such dye, to an electronic device comprising such dye and to the use of such dye.

1 Claim, 21 Drawing Sheets

|  | $J_{SC}$ [mA/cm2] | $V_{OC}$ [mV] | FF [%] | Eff. [%] |
|---|---|---|---|---|
| Dye 1 | 18.4 | 660 | 59 | 7.23 |

Fig. 10

|  | JSC [mA/cm2] | VOC [mV] | FF [%] | Eff. [%] |
| --- | --- | --- | --- | --- |
| Dye 1 | 18.4 | 660 | 59 | 7.23 |
| Dye 14 | 29.7 | 556 | 54 | 8.62 |
| Dye 15 | 35.7 | 575 | 44 | 8.96 |
| Mixture 1+14 | 30.8 | 565 | 52 | 8.98 |
| Mixture 1+15 | 35.8 | 665 | 56 | 13.41 |

Figure 12

|  | $J_{SC}$ [mA/cm2] | $V_{OC}$ [mV] | FF [%] | Eff. [%] |
|---|---|---|---|---|
| Dye 1 | 10.56 | 686 | 69.4 | 5.03 |
| Dye 16 | 11.23 | 617 | 72.6 | 5.02 |

Figure 14

| Dye | Voc [V] | Jsc [mA/cm2] | FF [%] | Eff. [%] |
|---|---|---|---|---|
| 1 | 0.702 | 10.89 | 68.6 | 5.23 |
| 9 | 0.715 | 11.50 | 72.4 | 5.95 |
| 2 | 0.593 | 8.62 | 69.7 | 3.61 |

|              | Voc [V] | Jsc [mA/cm2] | FF [%] | Eff. [%] |
|--------------|---------|--------------|--------|----------|
| Dye 15   | 0.697   | 18.75        | 66.9   | 8.74     |
| Mixture 1 + 15 | 0.745 | 19.30    | 69.4   | 9.97     |
| Mixture 9 +15  | 0.729 | 19.64    | 67.7   | 9.68     |

Figure 19

| Dyes | Voc [V] | Jsc [mA/cm2] | FF [%] | Eff. [%] |
|---|---|---|---|---|
| Dye 14 | 0.619 | 14.28 | 66.4 | 5.87 |
| Mixure 1+ 14 | 0.637 | 15.15 | 65.8 | 6.35 |
| Mixture 9+14 | 0.624 | 15.76 | 64.2 | 6.32 |

Figure 20a

| | Voc [V] | Jsc [mA/cm2] | FF [%] | Eff. [%] |
|---|---|---|---|---|
| Dye 14 | 0.621 | 13.01 | 67.4 | 5.45 |
| Mixture 1 + 14 | 0.633 | 14.47 | 63.4 | 5.81 |
| Mixture 9 + 14 | 0.639 | 14.16 | 66.9 | 6.05 |

DYE COMPRISING A CHROMOPHORE TO WHICH AN ACYLOIN GROUP IS ATTACHED

This application is a divisional application of U.S. Ser. No. 13/123,344 filed on Jul. 11, 2011 which is a 371 application of PCT/EP2009/006888 filed on Sep. 23, 2009.

The present invention relates to a dye comprising a chromophore to which an acyloin group is attached, to a method of synthesis of such dye, to an electronic device comprising such dye and to the use of such dye.

The dye-sensitised solar cell (DSSC) (B. O'Regan and M. Grätzel, Nature 353 (1991) 737; WO 91/16719 [A]) is a photovoltaic device that offers high energy-conversion efficiencies at low cost. In contrast to the silicon-based systems, where the semiconductor assumes both the task of light absorption and charge carrier transport, in DSSCs these functions are separated. Light is absorbed by a sensitizer dye which is anchored to the surface of a semiconductor such as nanocrystalline $TiO_2$. The charge separation takes place at the interface via photoinduced electron injection from the dye into the conduction band of the semiconductor. The dye molecule is regenerated from a counter electrode via a redox couple in the electrolyte. The redox couple is regenerated in turn at the counter-electrode the circuit being completed by electron transport through the external load.

The efficiency of a DSSC is determined by the number of collected and injected photons, and thus by the light absorbed by the dye sensitizer. One of the main criteria of a dye to act as efficient sensitizer in DSSC is its adsorption (by chemisorption) onto the semiconductor surface. Further, for high efficiencies, the ideal sensitizer should absorb efficiently over a broad range of solar spectrum. Upon photoexcitation the dye should inject electrons into the conduction band of the semiconductor with a quantum yield of unity. To minimize energy losses during electron transfer, the energy level of its excited state should be well matched with the lower bound of the conduction band of the semiconductor. Its redox potential should be well matched with that of the redox couple so that the dye regeneration via electron donation is possible.

The best photovoltaic performance has so far been achieved with carboxyl groups containing polypyridyl complexes of ruthenium (known as red-dye and black-dye). [M. K. Nazeeruddin, A. Kay, I. Rodicio, R. Humphry-Baker, E. Müller, P. Liska, N. Viachoppoulos, M. Grätzel, *J. Am. Chem. Soc.*, 1993, 115, 6382]. The photoexcitation of a Ru-complex results in an intramolecular metal-to-ligand charge-transfer (MLCT) transition. The photoexcited electrons located in the bipyridyl ligands can be very efficiently injected in the conduction band of the semiconductor via the carboxyl-anchor groups. This process has been shown to be very fast. [Y. Tachibana, J. E. Moser, M. Grätzel, D. R. Klug, J. R. Durrant, *J. Phys. Chem.* 1996, 100, 20056] In contrast, for these complexes the recombination process between the injected electrons in $TiO_2$ and the dye-cations is a slow process. The slow recombination is considered to be a result of the large separation between semiconductor and the $Ru^{3+}$ by the bipyridyl ligands. Thus, the molecular design of these Ru-complexes is successful in an efficient charge separation and thus, high energy conversion efficiency.

However, the energy conversion efficiency of the DSSC is limited by the light-harvesting capacity of these Ru-dyes to absorb the sunlight. The photo-active region of the photovoltaic device is reduced to the visible part of the solar spectrum, and within that, to the shorter wavelength region. The photons of the longer wavelength region are not harvested and cannot be converted to electrical energy.

So far most of the dyes employed as photosensitizers in the field of DSSC have as anchoring group carboxylic acid groups to anchor on to nanoporous semiconductor. This limits the pool of all dyes, organic, inorganic and hybrid that can be used as sensitizer. Other anchoring group which show good properties and have been more intensively studied are phosphonic acid groups (a) Grätzel et al, J. Phys. Chem. B, 2004, 108, 17553; b) W. Choi et al, J. Physl. Chem. B, 2006, 110, 14792-14799). Adsorption and charge injection could be further demonstrated with other anchoring groups like sulfonic acid, hydroxyl, triethoxysilane, catechol group and boronic acid, but no solar cells with significant efficiency of DSSC could be achieved with dyes having such anchoring groups (a) Grätzel et al, New. J. Chem., 2000, 24, 651-652; b) Ford et al., J. Phys. Chem. B, 1994, 98, 3822; c) Lakhimiri et al., J. Photochem. Photobiol., A, 2004, 166, 91.).

Nanoporous semiconductors, such as $TiO_2$, are key components in the process of heterogenous photocatalysis applied in the field of photocatalytic hydrogen production or photolytic water purification (Arakawa et al., *J. Photochem. Photobiol. A,* 2000, 63-69; b) Chanon, Eds. Elsevier, *Photoinduced Electron Transfer,* 1988). Most photocatalysts, such as nanoporous $TiO_2$, are active under UV irradiation, and their inactivity in the visible light region (solar light) limits their practical application. One of the strategies to overcome this is the anchoring of charge transfer dyes to the surface of the wide band gap semiconductor rendering them sensitive to visible sun light. As above, the dyes are generally linked to the semiconductor through a carboxylate linkages via a ester linkage. This linkage is quite unstable in water which is the environment in such processes. There is a need on alternative effective and stable anchoring groups for attaching dyes on the semiconductor surfaces.

Accordingly, it was an object of the present invention to provide for improved dyes with intense absorption in the visible and long wavelength region of the solar spectrum. It was another object of the present invention to provide for dyes which can be easily covalently attached to nanocrystalline wide band gap semiconductors, such as $TiO_2$, $SnO_2$ etc. It was furthermore an object of the present invention to provide for dyes that allow an efficient charge transfer from the dye to the semiconductor. It was furthermore an object of the present invention to provide for dyes that are easily accessible due simple methods of preparation.

All these objects are solved by a dye comprising a chromophore to which an acyloin group is attached, said dye being represented by formula 1a or 1b:

formula 1a or

formula 1b wherein said chromophore is an organic or metal-organic compound absorbing electromagnetic radiation in the range from 300-1200 nm, or a subrange thereof, preferably 350-500 nm or 500-750 nm or 350-700 nm, wherein A is selected from H, or any cyclic or acyclic alkyl, or any straight or branched chain moiety of general formula —$(CH_2)_{n1}$—R, —$[(CR=CR)_{n1}—(CH_2)_{n2}]_p$—R, —$[(C≡C)_{n1}—(CH_2)_{n2}]_p$—R, —$[(CH_2)_{n1}—X_{n2}]_p$—R, or halogen, such as F, Cl, Br, I, or moieties containing heteroatoms, such as $NO_2$, CN, $NR_2$, —OH or any substituted or non-substituted phenyl or biphenyl or heteroaryl, or moieties forming a ring structure with said acyloin group, wherein, at each occurrence and independently, n1 and n2=0-12, preferably 0-4, p=0-6, preferably 0-2, wherein X is selected from —$CR_2$, O, S, NR, —CR, wherein R is selected from H or any straight or branched alkyl chain of general formula—$C_nH_{2n+1}$, or —$COOR^1$, —$OR^1$, —$SR^1$, —$NR^1_2$, or F, Cl, Br, I, O, N, $NO_2$, CN, $CF_3$, wherein $R^1$ is H or any straight or branched alkyl chain of general formula —$C_nH_{2n+1}$, or any substituted or non-substituted phenyl or biphenyl, heteroaryl, n=0-12, preferably 0-6.

In one embodiment, the dye according to the present invention comprises a chromophore to which an acyloin group is attached, said dye being represented by formula 2a, 2b, 2c, 2d, 2e, 2f, 2g, 2h, 2i, or 2j

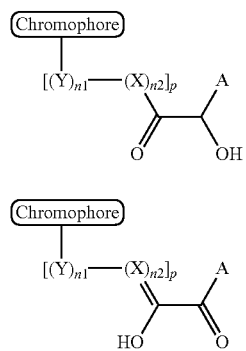

formula 2a formula 2b formula 2c formula 2d formula 2e

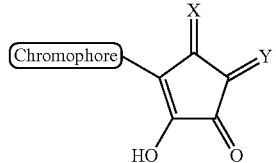

formula 2f

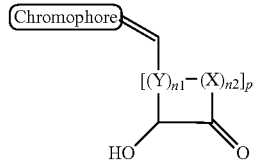

formula 2g

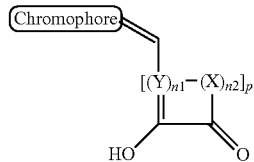

formula 2h

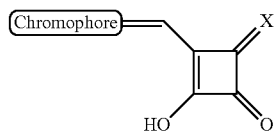

formula 2i formula 2j wherein A, X, n1, n2, n, p are as defined above, and wherein Y, at each occurrence, is independently selected from —$CR_2$, O, S, NR, —CR, R being as defined above.

In one embodiment, the dye according to the present invention is represented by formula 2d, 2e, 2f, or 2h In one embodiment, said chromophore is selected from the moieties shown in formula 3

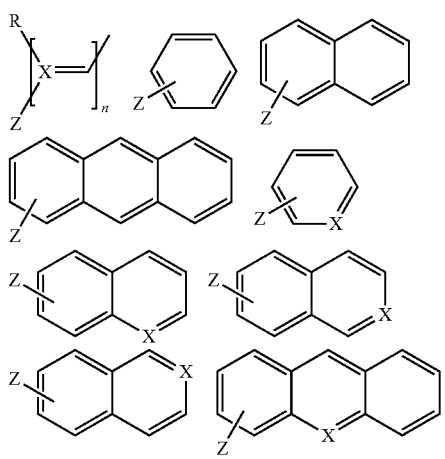

(formula 3)

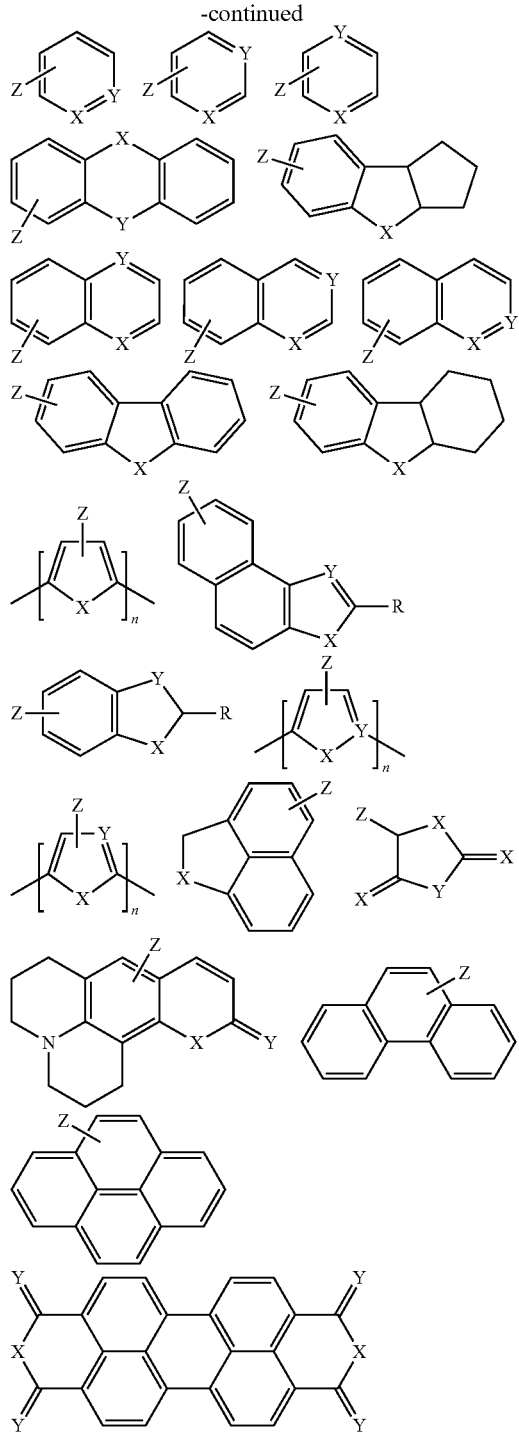

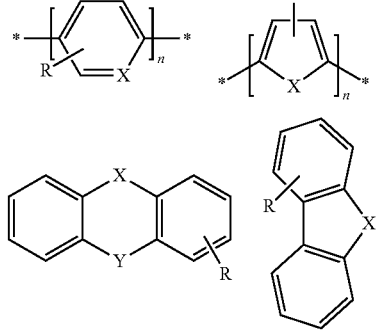

and wherein R, X, Y, n, $n_1$, $n_2$ and p are as defined above.

In one embodiment, the dye according to the present invention is represented by formula 5

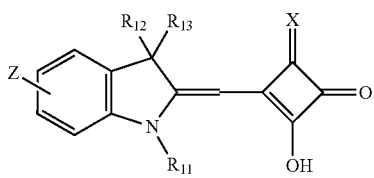

wherein $R_{11}$, $R_{12}$, $R_{13}$, at each occurrence, are independently selected from H or any straight or branched alkyl chain of general formula $-C_nH_{2n+1}$, or $-COOR^1$, $-OR^1$, $-SR^1$, $-N R^1_2$, or F, Cl, Br, I, O, N, $NO_2$, CN, $CF_3$, wherein $R^1$ is H or any straight or branched alkyl chain of general formula $-C_nH_{2n+1}$ or any substituted or non-substituted phenyl or biphenyl, heteroaryl, n=0-12 preferably 0-6, and wherein X and Z are as defined above.

In one embodiment, the dye according to the present invention is represented by formula 6

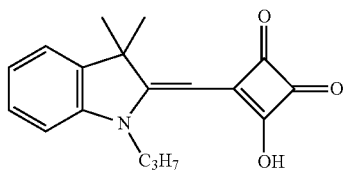

or is represented by any of structures 17-26:

or any combination of the moieties represented by formula 3, wherein said chromophore is linked to said acycloin group by any of the C-atoms or X or Y or R within said chromophore, wherein Z is one or more moieties which, at each occurrence, is independently selected from H, or any cyclic or acyclic alkyl, or any straight or branched chain moiety of general formula $-(CH_2)_{n1}-R$, $-[(CR=CR)_{n1}-(CH_2)_{n2}]_p-R$, $-[(C \equiv C)_{n1}-(CH_2)_{n2}]_p-R$, $-[(CH_2)_{n1}-X_{n2}]_p-R$, or halogen, such as F, Cl, Br, I, or moieties containing heteroatoms, such as $NO_2$, CN, $NR_2$, $-OH$ or any substituted or non-substituted phenyl or biphenyl or heteroaryl, preferably represented by formula 4

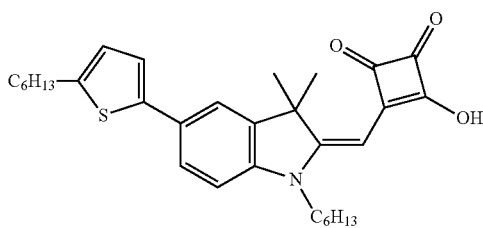

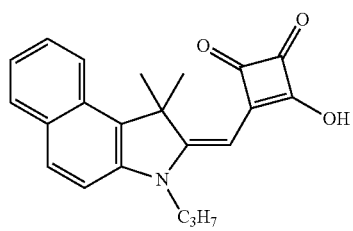
18
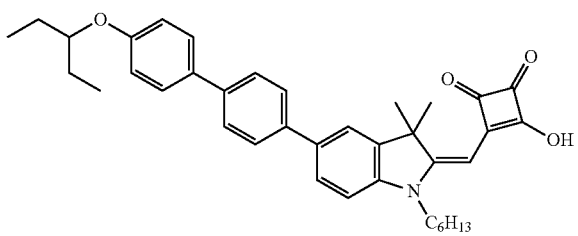
19
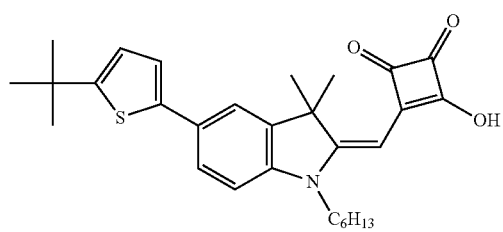
20
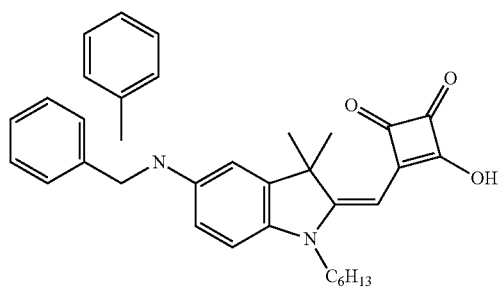
21
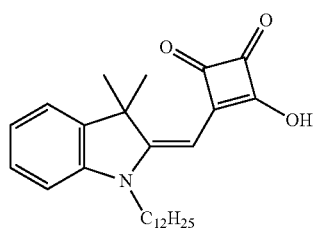
22
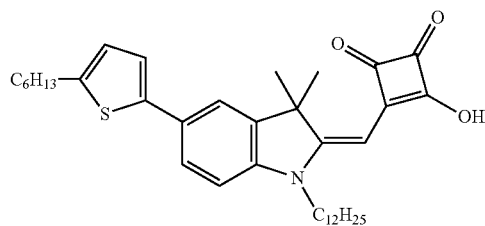
23
24
25
26
In one embodiment, the dye according to the present invention is represented by formula 7
(formula 7)
wherein $R_{11}$, Z, and X are as defined in above, or is represented by formula 8
(formula 8)
wherein $R_{11}$, $R_{12}$, $R_{13}$, Z, X and Y are as defined above, or is represented by formula 9

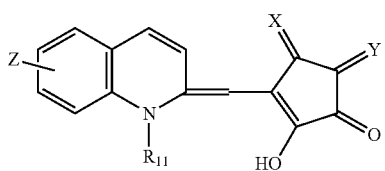

(formula 9)

wherein R$_{11}$, Z, X and Y are as defined above, or is represented by formula 10

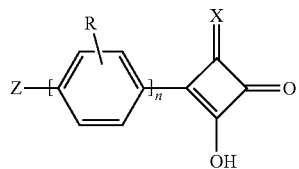

(formula 10)

wherein R, Z, X and n are as defined above, or is represented by formula 11

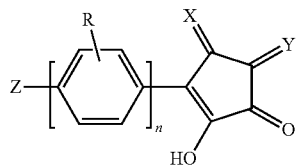

(formula 11)

wherein R, Z, X, Y and n are as defined above, or is represented by formula 12

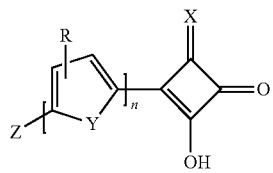

(formula 12)

wherein R, Z, Y, X and n are as defined above, or is represented by formula 13

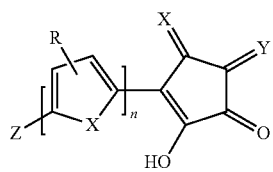

(formula 13)

wherein R, Z, X, Y, n are as defined above.

In one embodiment, said chromophore is a metal complex selected from the structures represented by formula 14

(L)$_{n3}$(L')$_{n4}$M(Hal)$_{n5}$ (formula 14)

M being Ruthenium Ru, Osmium Os, or Iridium Ir, preferably Ruthenium,

Hal being independently selected from Cl, Br, I, CN, —NCS, preferably —NCS with n3, n4, n5 being integers which, at each occurrence, are independently 0-4, preferably 2 or 3, and L and L' being organic heterocyclic ligands containing nitrogen atoms which are linked by N-atoms to the respective metal M, and wherein either one of L and L', or both L and L' are linked to the acyloin group by any of the C-atoms within said ligands.

In one embodiment, said ligands L and L' are independently, at each occurrence, mono- or polycyclic, condensed rings or such rings covalently bonded to each other.

In one embodiment, said ligands L and L' are independently, at each occurrence, selected from the group comprising

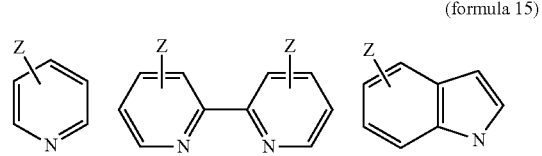

(formula 15)

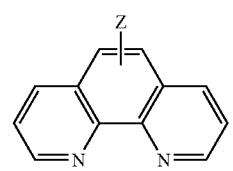

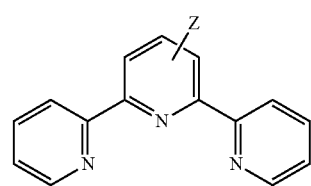

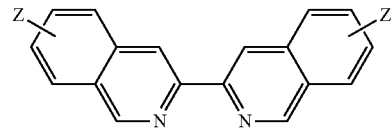

wherein Z is as defined above.

In one embodiment, said chromophore is a metal complex represented by formula 16

(L")$_{n6}$M' (formula 16)

M' being Palladium Pd, Platinum Pt or Nickel Ni, preferably Pd, and n6 being an integer 0-4, preferably 1-2, and L" being an organic heterocyclic ligand containing nitrogen atoms, said ligand being linked by one or several of said N-atoms to the respective metal M', and said ligand being linked to said acyloin group by any of the C-atoms within said ligand.

In one embodiment, said ligand L" is selected from the group comprising

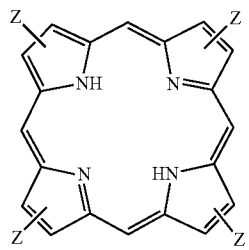 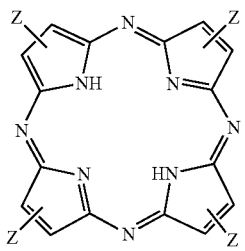

(formula 17)

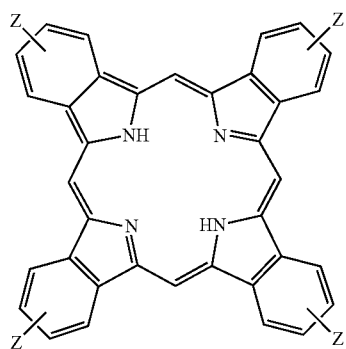

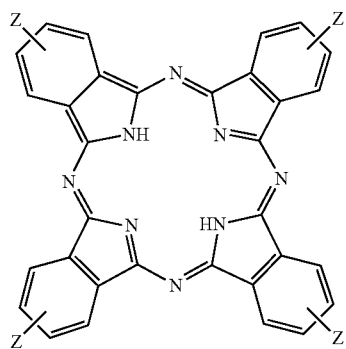

wherein Z is as defined above.

The objects of the present invention are also solved by an electronic device comprising a dye as defined above.

In one embodiment, the device according to the present invention is a solar cell, preferably a dye-sensitized solar cell (DSSC), said solar cell further comprising a photoactive semiconductor porous material.

In one embodiment, the device according to the present invention contains a charge-transporting agent which is a liquid, polymer gel based or solid state electrolyte.

In one embodiment, the device according to the present invention is a solar cell wherein said dye is chemisorbed to said photoactive semiconductor porous material.

In one embodiment, the device according to the present invention further comprises at least one other dye.

In one embodiment, said at least one other dye is a dye according to the present invention.

In one embodiment, said at least one other dye is a dye selected from structures 15, 27-32:

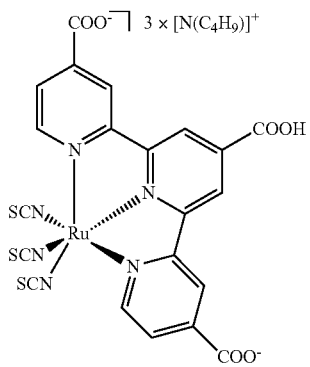

15

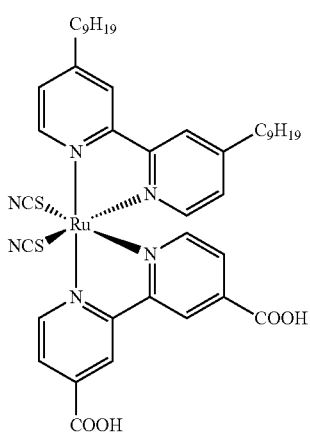

27

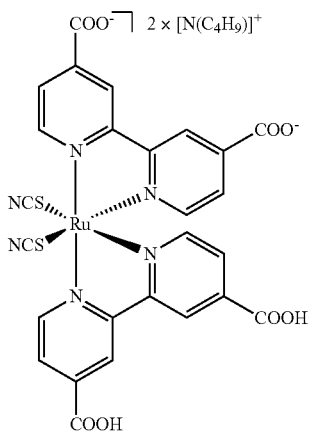

28

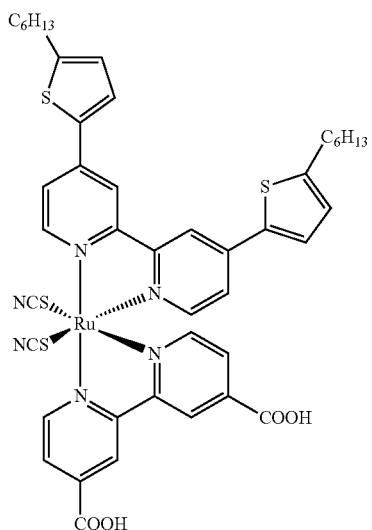

29

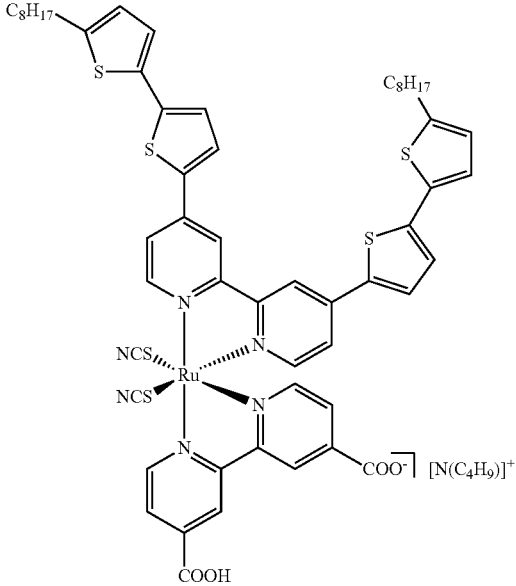

31

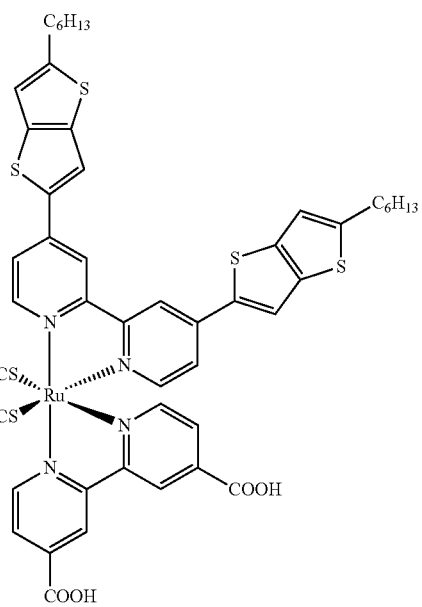

32

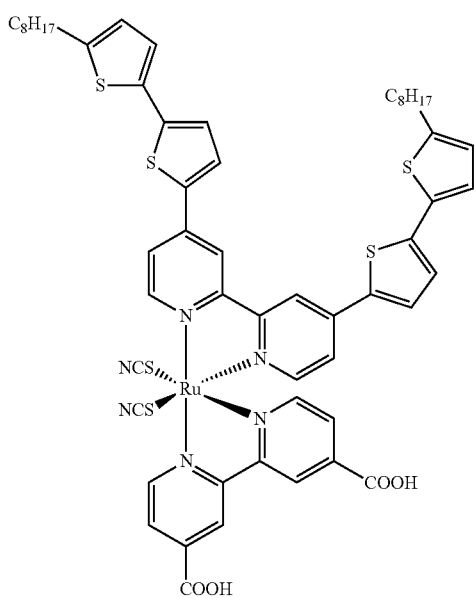

30

In one embodiment, said photoactive semiconductor porous material is selected from $TiO_2$, $SnO_2$, ZnO, $Nb_2O_5$, $ZrO_2$, $CeO_2$, $WO_3$, $Cr_2O_3$, $CrO_2$, $CrO_3$, $SiO_2$, $Fe_2O_3$, CuO, $Al_2O_3$, $CuAlO_2$, $SrTiO_3$, $SrCu_2O_2$, $ZrTiO_4$, preferably $TiO_2$, and combinations of the foregoing.

In one embodiment, said photoactive semiconductor porous material has one or several of the following features:
- a thickness of 1-100 μm, preferably 5-30 μm,
- consists of one or more layers
- contains particles having an average diameter or length in the range of from 1 nm to 40 nm, preferably 15-30 nm
- is a mixture of at least a first and second kind of particles, said first kind of particles having an average diameter or length in the range of from 1 nm to 30 nm, and said second kind of particles having an average diameter in the range of from 30 nm to 100 nm and/or a length in the range of from 100 nm to 5 μm.

The objects of the present invention are also solved by the use of a dye according to the present invention as a sensitizer in a dye-sensitized solar cell.
In one embodiment, said use is together with at least one other dye.
In one embodiment, said at least one other dye is a dye as defined above, or a dye selected from structures 15, 27-32:
15
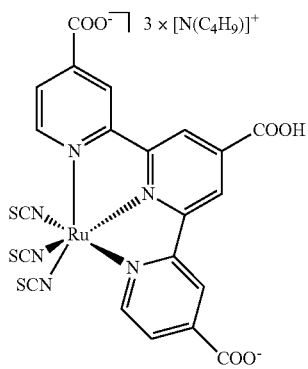
27
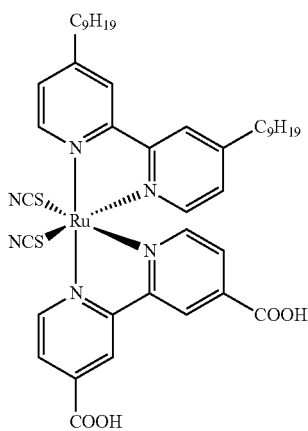
28
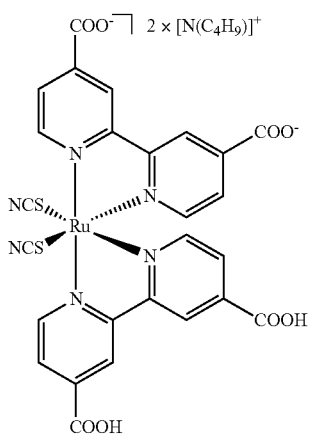
29
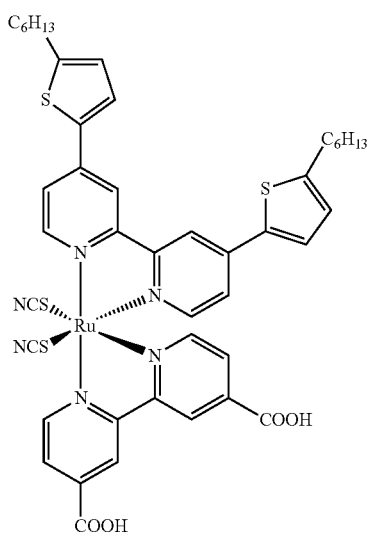
30
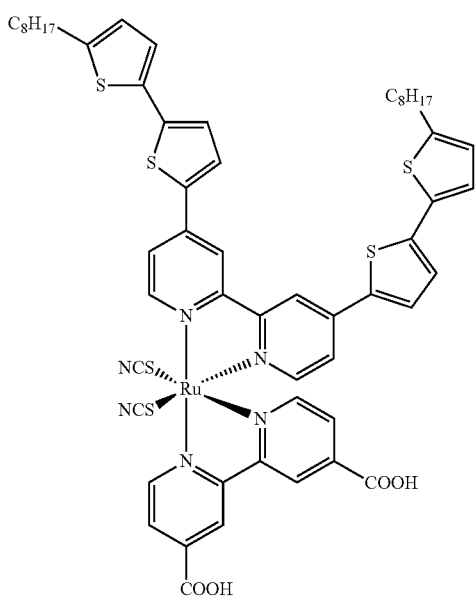

-continued

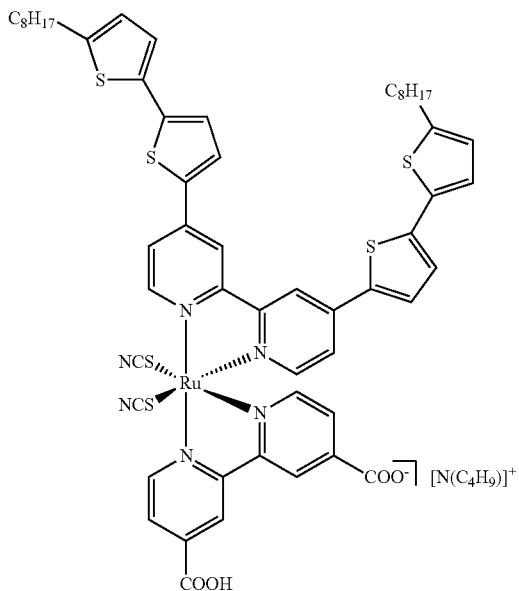

31

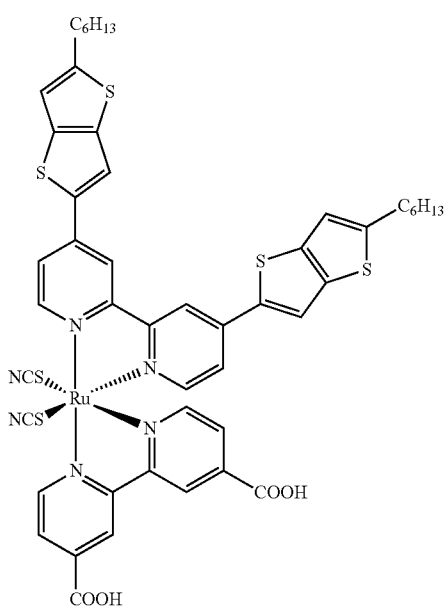

32

In one embodiment, said use together with at least one other dye is in a dye-sensitized solar cell having a tandem geometry (as, e.g., described in Example 9 below), or the mixture of a dye in accordance with the present invention and at least one other dye is used for coating an electrode of said dye-sensitized solar cell.

The objects of the present invention are also solved by the use of a dye according to the present invention, as a photosensitizer in a photocatalytic process, such as photocatalysed hydrogen production or photocatalytic degradation of organic pollutants. It should be noted that any photocatalytic process may be useful in the context of the present invention.

In one embodiment, during preparation of the device, the dye molecules are adsorbed to the nanoporous particles via self-assembling out of a dye solution or a dyes-mixture solution.

Examples of electronic devices comprising a dye in accordance with the present invention include energy supply devices for portable electronic devices and displays, such as solar cell panels for or incorporated in mobile phones, notebooks, laptops, portable audio-tape players, MP3-players, remote controls, e-cards, e-books, e-readers, portable CD-players, portable DVD-players, cameras, digicams, GPS devices, portable sensors, displays integrated in electronic devices. Examples of electronic devices in accordance with the present invention also include portable solar chargers for batteries of any of the afore-mentioned devices. Moreover, electronic devices in accordance with the present invention include smart windows, on-roof-applications, especially in areas where a grid connection is not possible, e.g. camping cars, boats. If the electronic device in accordance with the present invention is an energy supply device, and said energy supply device is a solar cell panel, such panel is preferably a dye-sensitized solar cell panel (DSSC panel) (see also FIG. 21).

The objects of the present invention are also solved by the use of a dye according to the present invention, for the sensitization of the photocatalyst, such as $TiO_2$, in photocatalytic processes, e.g in photocatalysed hydrogen production, photocatalytic splitting of water or photocatalytic decomposition of pollutants.

As used herein, the term "dye" is meant to refer to a chromophore to which an acyloin group is attached. The term "chromophore", as used herein, is meant to refer to an organic or metal-organic compound which is able to absorb electromagnetic radiation in the range of from 350 nm to 1100 nm, or a subrange thereof, e.g 350-500 nm or 500-850 nm, or 350-850 nm. An acyloin group is the moiety which is included in the structure of the dyes according to present invention and is represented by formula 18

(formula 18)

$$\underset{HO}{\overset{*}{\underset{|}{C}}}\underset{O}{\overset{*}{\underset{\|}{C}}}$$

The term "anchoring group", as used herein, is meant to refer to any functional group that allows a covalent coupling (chemisorption) of the entity to which such anchoring group belongs, to a surface, for example the surface of a nanoporous semiconductor layer within a solar cell.

A dye is referred to as being "chemisorbed" to a layer or surface, if the dye is covalently coupled thereto.

With reference to formula 3 which exemplifies a "chromophore" in accordance with the present invention, the term "a combination of the moieties represented by formula 3" is used. This is meant to encompass any molecule wherein one or several of the structures given in formula 3 are covalently linked to each other to also produce a "chromophore".

The term "substituted phenyl/biphenyl" is meant to refer to any phenyl/biphenyl wherein a hydrogen has been replaced by a substituent, such as a halogen, $NO_2$, $NH_2$, OH or other suitable functional groups. Such substituents have for example been defined above as Z, which substituents may also be substitutents at a phenyl or biphenyl.

The inventors have surprisingly found that using acyloin groups as anchoring groups for a dye allows an efficient covalent attachment of such dye to nanoporous surfaces of photoactive layers, such as $TiO_2$-layers. The dyes having the acyloin group attached as anchoring group can be used as sensitizers in solar cells but also for sensitizing the photocatalyst which are mostly wide band gap oxide semiconductors such as $TiO_2$, to extend the photocatalytic activity of the photocatalysts into the visible light region. This is particular important for example in the field of heterogeneous photocatalysis such as photolytic hydrogen production or photocatalytic water production or photocatalytic destruction of organic pollutants. In using the approach in accordance with the present invention, the number of dyes that can be potentially used in such applications is strongly increased. Moreover, the synthesis of such dyes is surprisingly simple.

The dyes according to the present invention show high quantum efficiency similar to that of the standard red-dye. If one therefore combines the dyes of the present invention with other dyes, such as other organic dyes or standard red dye or standard black dye, a broad range of the solar spectrum may be harvested. That makes the dyes of the present invention very promising to be used together with other dyes, such as organic dyes, standard red dye or standard black dye or further dyes according to the present invention with absorption maxima at different wavelengths. A dye sensitized solar cell comprising a dye according to the present invention, and, in addition thereto, one or more further dyes, is herein also referred to as a multiple-dyes sensitized solar cell (M-DSSC). Preferably, said one or more further dyes is also a dye according to the present invention.

Further, organic dyes have high absorption coefficients. This means it needs less amount of dye to absorb the same amount of light. Less amount of one dye on a surface enables the use of more dyes with different absorption properties, ideally being a mixture of dyes absorbing the whole range of the sun spectrum.

Furthermore, reference is made to the figures, wherein

FIG. 1 shows a synthesis scheme of one example dye in accordance with the present invention being represented by general formula 2e, E being Cl or an alkoxy group, preferably ethoxy, propoxy, iso-propoxy or butoxy, X being as defined above, chromophore being as defined above, FIG. 2 shows a synthesis scheme of one example dye in accordance with the present invention being represented by general formula 2h, E, Y, X, $n_1$, $n_2$, p, chromophore being as defined above, Hal$^-$ being I$^-$, Cl$^-$, Br$^-$, NCS$^-$ or SCN$^-$, FIG. 3 shows a synthesis scheme of one example dye in accordance with the present invention being represented by general formula 5, E, Z, $R_{11}$-$R_{13}$, X being as defined above, FIG. 4 shows a synthesis scheme of one example dye in accordance with the present invention being represented by general formula 9, X, Y, Z, $R_1$ being as defined above, FIG. 5 shows the molecular structure of some dyes according to present invention, FIG. 6 shows the synthesis of one example dye in accordance with the present invention being represented by formula 1, FIG. 7 shows the synthesis of one example dye in accordance with the present invention being represented by formula 2, FIG. 8 shows the synthesis of one example dye in accordance with the present invention being represented by formula 5, FIG. 9 shows a photograph of the adsorption of dye in accordance with the present invention being represented by formula 1 on a $TiO_2$ layer, FIG. 10 shows a table indicating the performance of a dye sensitized solar cell prepared with a dye in accordance with the present invention being represented by formula 1 by measuring the efficiency of solar cells by means of sulphur lamp, FIG. 11 shows the incident photon to current efficiency (IPCE) plotted against wavelength for a dye in accordance with the present invention being represented by formula 1, FIG. 12 shows a table displaying the performance of various dye sensitized solar cells prepared with a dye in accordance with the present invention being represented by formula 1 in mixture with other dyes and in comparison to other sensitizers, FIG. 13 shows the incident photon to current efficiency of a dye in accordance with the present invention being represented by formula 1, of a dye being represented by formula 14 (FIG. 15) and a mixture of these two dyes, plotted against wavelength, FIG. 14 shows a table indicating the performance of a dye sensitized solar cell prepared with a dye in accordance with the present invention being represented by formula 1 in comparison with organic dye being represented by formula 16 (FIG. 15), by measuring the efficiency of solar cells by means of sun simulator, FIG. 15 shows the structure of other sensitizers that were used for comparison and in mixture with dyes according to present invention (sensitizers 14, 15 and 16).

FIGS. 18-20 show various tables and IPCE curves showing the efficiencies of solar cells, as prepared and described in Examples 11) to 13).

Moreover reference is made to the following examples which are given to illustrate, not to limit the present invention.

Examples

Figure 6:
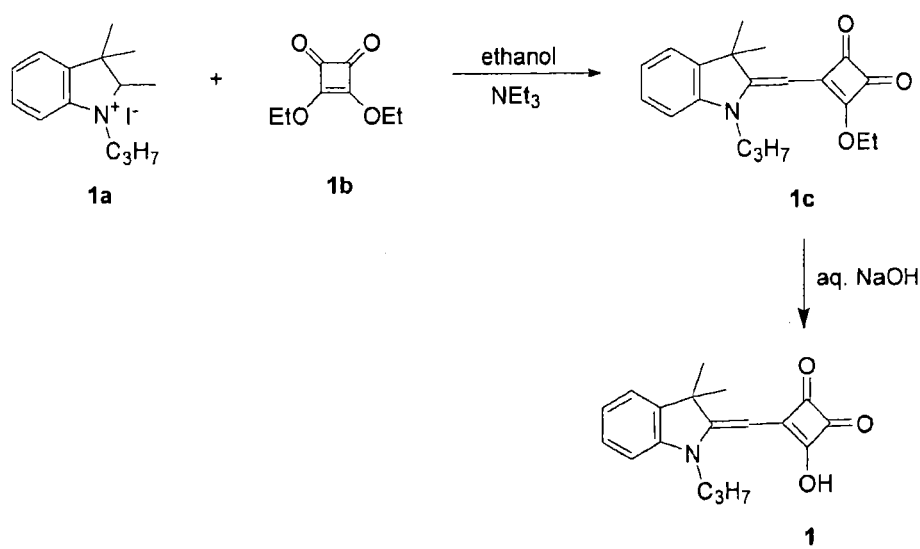

1) Synthesis of One Embodiment of a Dye in Accordance with the Present Invention, in this Case Dye 1:

FIG. 6 shows the synthesis scheme of dye 1 in accordance with the present invention.

An equimolar amount of 1a and diethylester derivative of squaric acid 1b in ethanol is heated in presence of small amount triethylamine to 70° C. for 4 h. The solvent is removed and the crude product is purified by column chromatography on silica gel with n-hexane/ethylacetate as eluent to yield the pure product 1e.

In next step, to derivative 1c in ethanol aqueous NaOH is added and the mixture stirred for 2 h at 50° C. After cooling, aq. HCl is added and the solvent is removed. The crude product is purified by column chromatography on silica gel with dichloromethane/methanol as eluent.

The dye 1 in accordance with the present invention is isolated as yellow solid.

Figure 7:
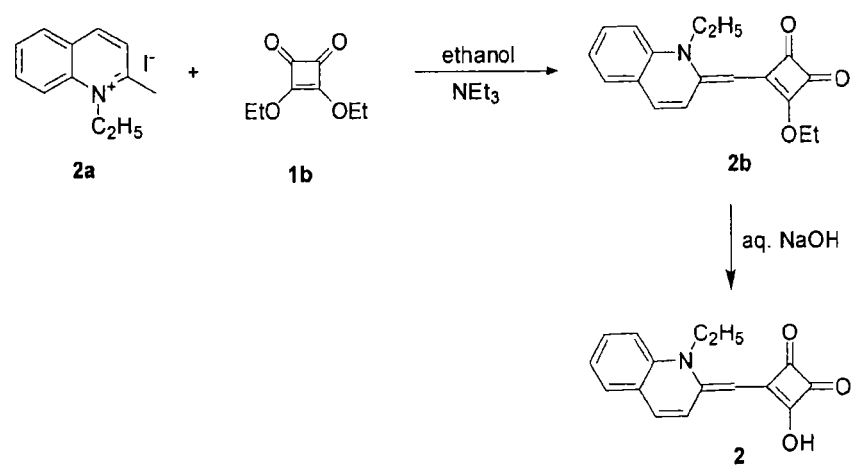

2) Synthesis of One Embodiment of a Dye in Accordance with the Present Invention, in this Case Dye 2:

FIG. 7 shows the synthesis scheme of dye 2 in accordance with the present invention.

An equimolar amount of 2a and diethylester derivative of squaric acid 1b in ethanol and in presence of small amount triethylamine is heated to 80° C. for 6 h. The solvent is removed and the crude product is purified by column chromatography on silica gel with n-hexane/ethylacetate as eluent to yield the pure intermediate 2b.

In next step, to 2b in ethanol aqueous NaOH is added and the mixture stirred for 2 h at 50° C. After cooling, aq. HCl is added and the solvent is removed. The crude product is purified by column chromatography on silica gel with dichloromethane/methanol as eluent. The dye 2 in accordance with the present invention is isolated as yellow-orange solid.

Figure 8:
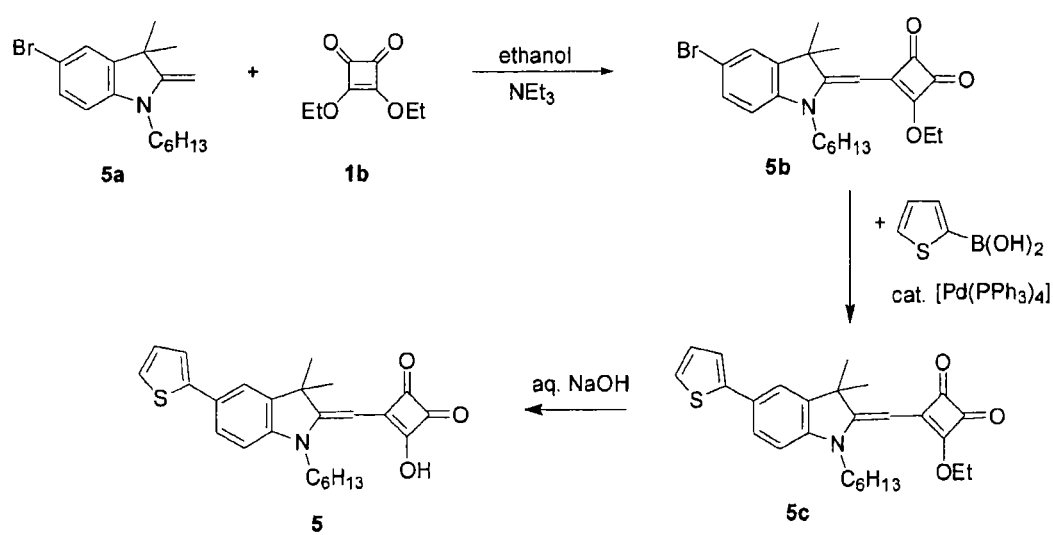

3) Synthesis of One Embodiment of a Dye in Accordance with the Present Invention, in this Case Dye 5:

FIG. 8 shows the synthesis scheme of dye 5 in accordance with the present invention.

An equimolar amount of brominated derivative 5a and diethylester derivative of squaric acid 1b in ethanol and in presence of small amount triethylamine is heated to 80° C. for 6 h. The solvent is removed and the crude product is purified by column chromatography on silica gel with n-hexane/ethylacetate as eluent to yield the pure intermediate 5b.

In a next step, to a mixture of 5b in of toluene/methanol, 1.2 equivalents of thienyl boronic acid, 1 mol % Pd-catalyst, 10 equivalents $K_2CO_3$ are added. The mixture is allowed to stir at 120° C. for 12h. After cooling the solvent is evaporated. The crude product is purified by column chromatography on silica gel with n-hexane/ethylacetate as eluent to yield pure 5c.

In a subsequent reaction to 5c in ethanol, aqueous NaOH is added and the mixture stirred for 2 h at 50° C. After cooling, aq. HCl is added and the solvent is removed. The crude product is purified by column chromatography on silica gel with dichloromethane/methanol as eluent. The pure dye 5 in accordance with the present invention is isolated as orange solid.

4) Analytical Data of Dye 1

C18H19NO3 (297.36)

1H NMR (400 MHz, MeOD): δ=14.8 (s, 1H, —OH), 7.27-7.20 (m, 2H, arH), 6.98-6.92 (m, 2H, arH), 5.70 (s, 1H, =CH—), 3.95 (t, 2H, N—CH2), 1.84-1.75 (m, 2H, CH2-Pr), 1.65 (s, 6H, arCH3), 1.06 (t, 6H, CH3-Pr)

ESI MS m/z=297.8 [M+].

UV/VIS (acetonitrile): λmax=404 nm.

5) Effective Adsorption of the Dye on TiO2

Figure 9:
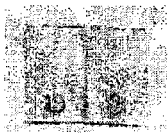

FIG. 9 shows a photograph of the adsorption of dye 1 in accordance with the present invention on a $TiO_2$ layer For device preparation, the substrate with screen printed nanoporous TiO2 particles is poured and kept in a dye or dyes mixture solution for at least 1 h. The dye molecules having the acyloin group as anchor group are able to adsorb onto the nanoporous layer via self-assembling. The effective adsorption and chemisorption (covalent coupling) of the dyes with acyloin group onto semiconductor surface is proved by the stable color of the substrate even after the substrate was washed with an organic solvent.

6) General Protocol for Preparing Solar Cells

The DSSCs are assembled as follows: A 30-nm-thick bulk $TiO_2$ blocking layer is formed on FTO (approx. 100 nm on glass or flexible substrate). A 5-30 μm-thick porous layer of $TiO_2$ semiconductor particles of 0.1882 $cm^2$ active area multi-printed by screen printing on the blocking layer and sintered at 450° C. for half an hour. Dye molecules are adsorbed to the nonporous particles via self-assembling out of a dye-solution. The dye-solution consists of a single dye or single dye and an additive, such as deoxycholic acid or a mixture of dye in different ratio or a mixture of dye in different ratio and an additive. The porous layer is filled with liquid electrolyte containing $I^-/I_3^-$ as redox couple (15 mM) by drop casting. A reflective platinum back electrode is attached with a distance of 6 μm from the porous layer.

7) Measuring the Efficiency of DSSCs Containing at Least One of the Sensitizer Dye Produced by the Method of the Present Invention The quality of the cells is evaluated by means of current density (J) and voltage (V) characteristics under illumination with light from
a) a sulphur lamp (IKL Celsius, Light Drive 1000) with an intensity of 100 mW $cm^{-2}$. If not otherwise stated, the results are averages over three cells.
b) a sun simulator (AM1.5G YSS-150) with an intensity of 100 mW $cm^{-2}$.

If not otherwise stated, the results are averages over three cells.

The efficiency of a photovoltaic device is calculated as follows:

$$\eta = P_{out}/P_{in} = FF \times (J_{SC} \times V_{OC})/(L \times A)$$

with $FF = V_{max} \times I_{max}/V_{oc} \times I_{sc}$

FF=fill factor $V_{OC}$=open circuit voltage $J_{SC}$=short current density

L=intensity of illumination=100 mW/$cm^2$

A=active area=0.24 $cm^2$ $V_{max}$=voltage at maximum power point $J_{max}$=current at maximum power point An important parameter for judging the performance of a dye as sensitizer in DSSC is the IPCE curve. The IPCE curve reflects the photo-activity of the sensitizer dyes at different wavelengths (IPCE=incident photon to current efficiency).

Figure 1:
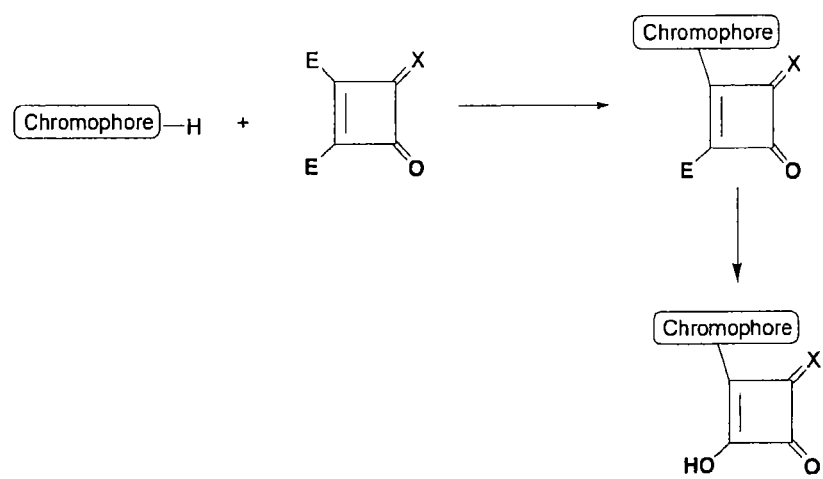
Figure 2:
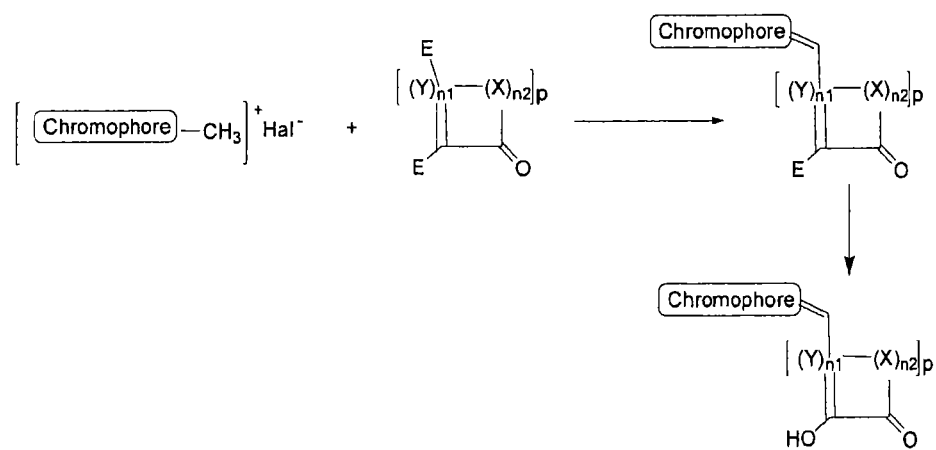
Figure 3:
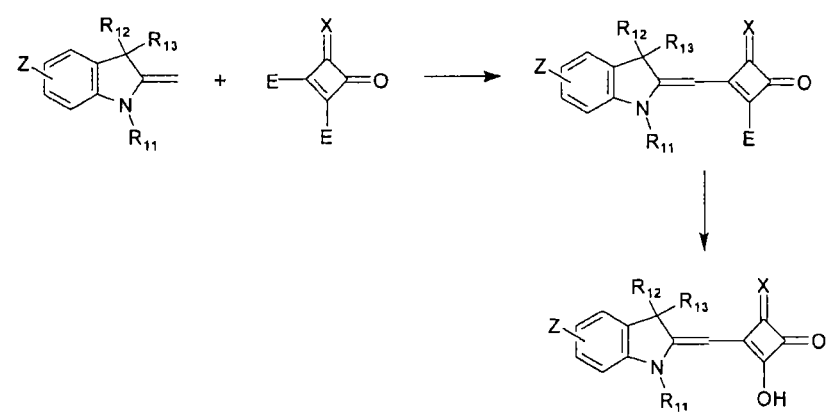
Figure 4:
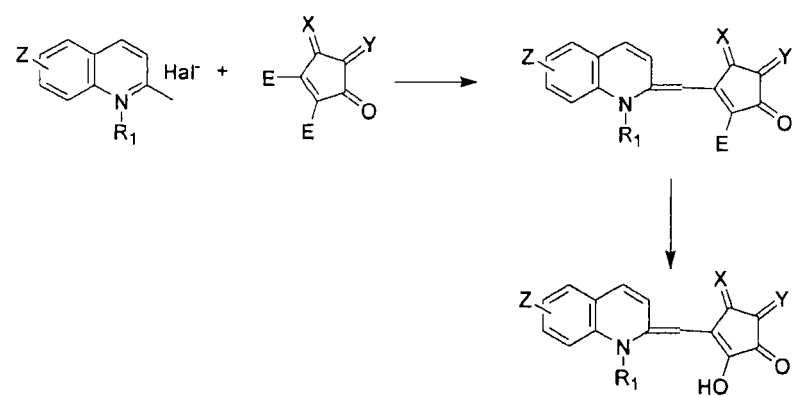
Figure 5:
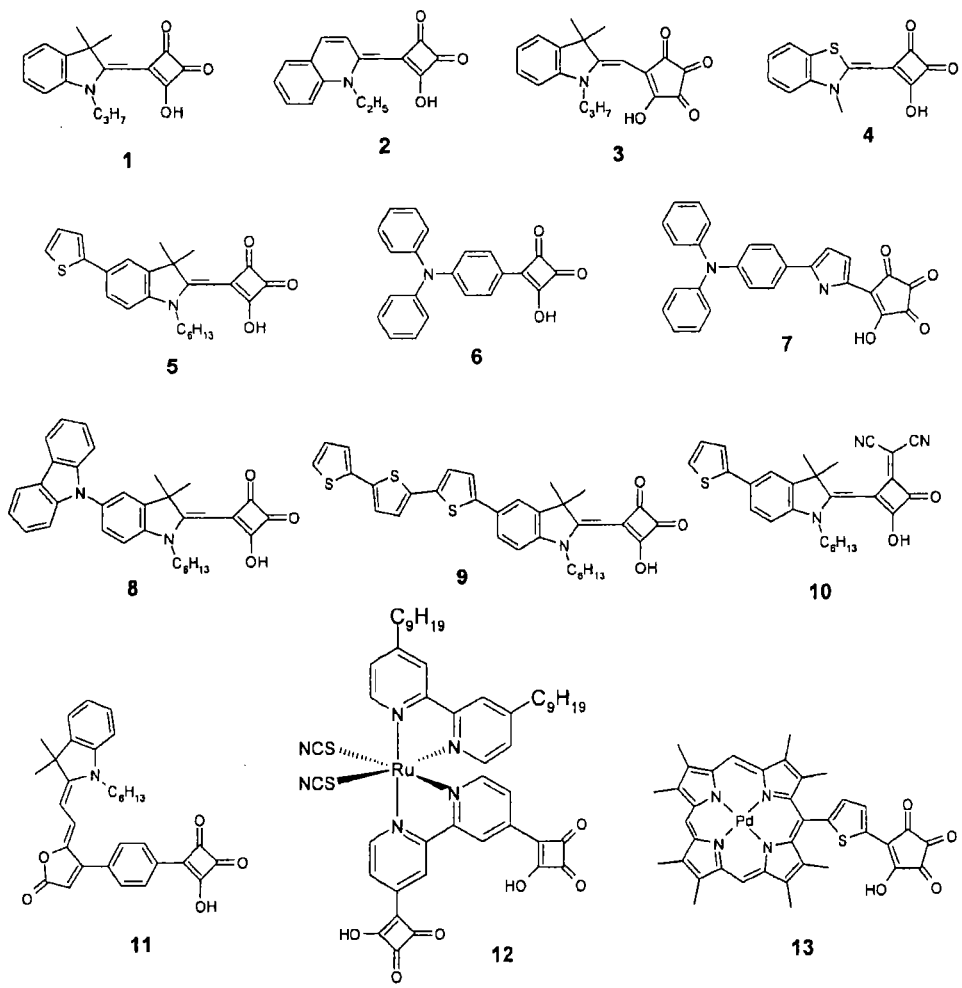
Figure 15:
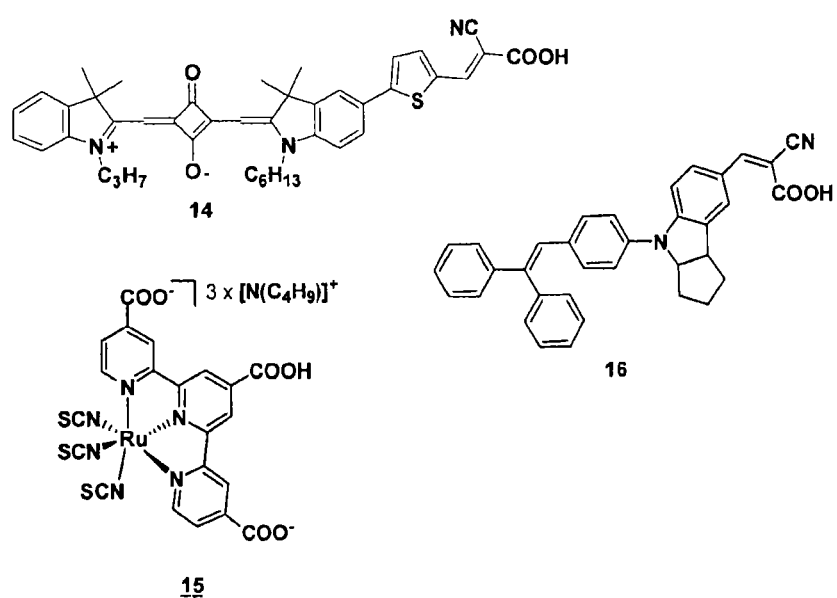
Figure 16:
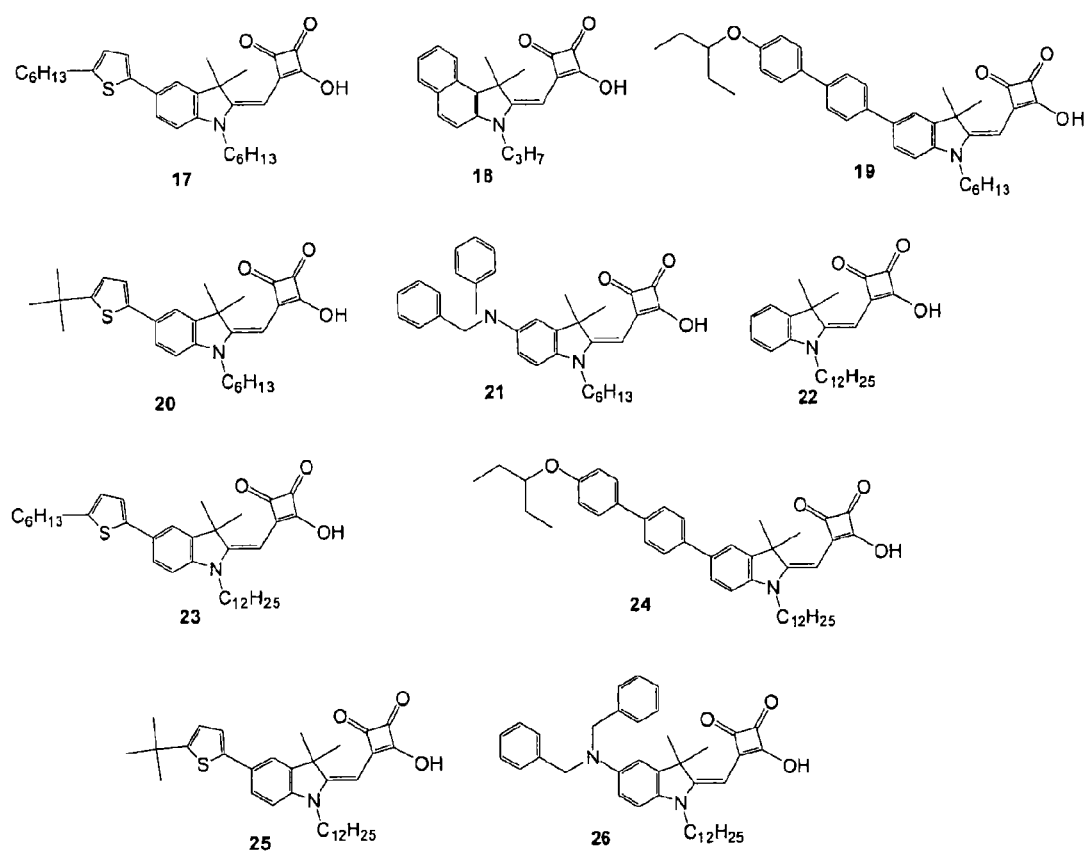
FIG. 16 shows structures 17-26 which are exemplary dyes in accordance with the present invention.
Figure 17:
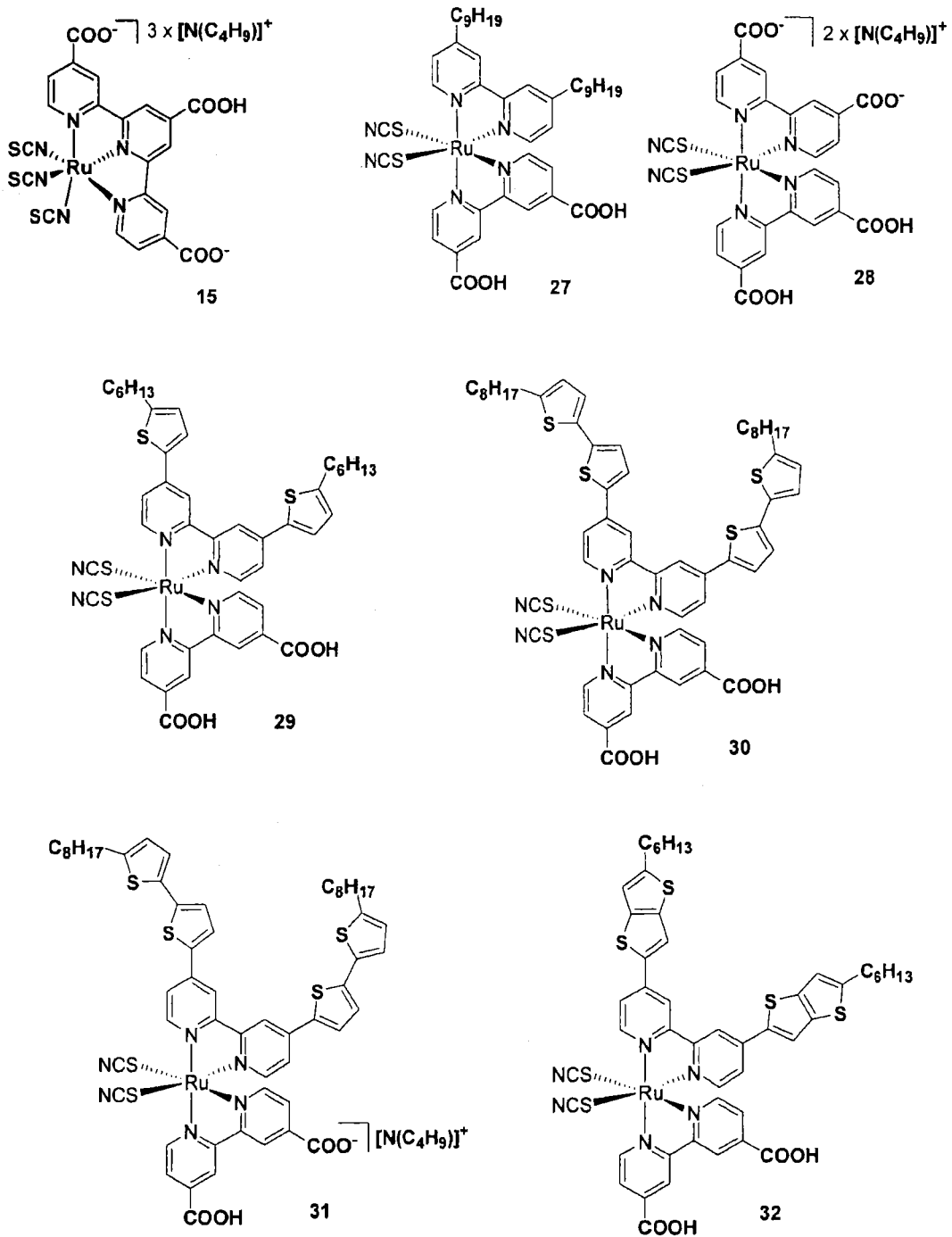
FIG. 17 shows exemplary structures 15, 27-32 of other dyes which can be used together with the dyes in accordance with the present invention.

The respective structure of the dyes is given in FIGS. 5 and 15.

8) Efficiency of the DSSC by Using Dye 1 as Sensitizer

Figure 10:
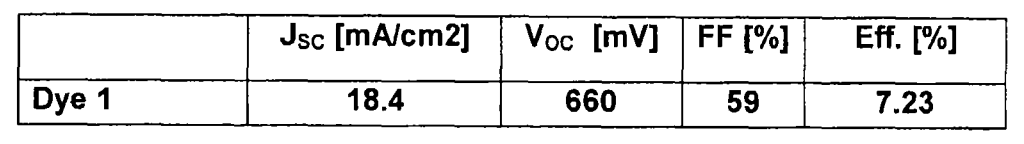
Figure 11:
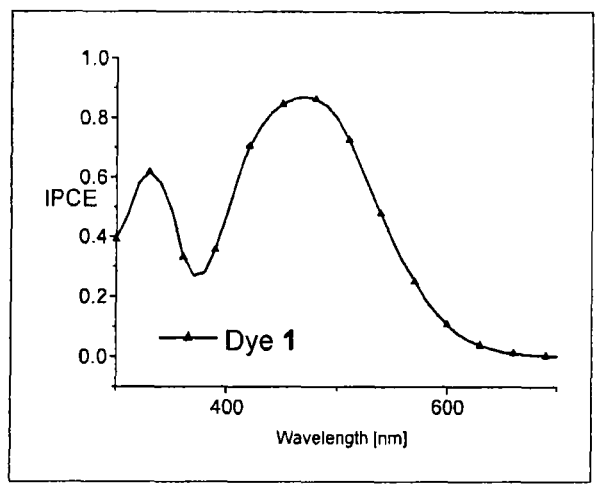

The performance and the efficiency of DSSCs prepared by method described in 6 and measured by method described in 7a with dye 1 are shown in FIG. 10. FIG. 11 shows the IPCE plotted verses wavelength for sensitizer 1.

The efficiency of the DSSC prepared with sensitizer dye 1 shows high efficiency (>7%). There are only few other organic dyes, such as dye 16, showing such high performance.

However, the superiority of the dyes according to present invention lies not only in the high efficiencies of the DSSCs achieved when using these dyes, but also in their simple preparation (FIGS. 1-4).

The highest achievable IPCE value is 1.0. Sensitizer dye 1 shows an IPCE value of 0.9 in its maximum at ca. 490 nm. That means that the photons absorbed in this region from the sun can be converted to almost 90% to current by injection into conduction band of $TiO_2$. Such a high value is rarely achieved and only with few dyes, such as the Ruthenium based standard red dye.

9) Efficiency of M-DSSC Containing a Mixture of Dye 1 and the Organic Dye 14, and a Mixture of Dye 1 and Standard Black Dye 15

The solar cells were prepared by method described in Example 6 and measured according to Example 7a. For comparison also DSSCs prepared with the respective single sensitizer dye were prepared and measured.

The performance and the efficiency of DSSCs are shown in FIG. 12.

A mixture of the dye in accordance with the present invention, in this case dye 1, with either an organic dye 14 or with a Ruthenium based dye (black dye) 15 yields an increase in short current density and thus, a drastic increase in DSSC efficiency.

Figure 13:
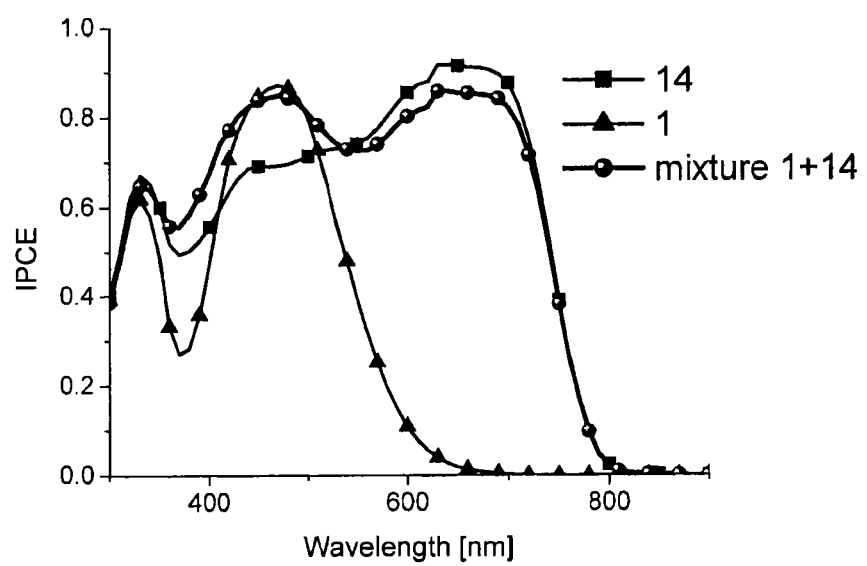

FIG. 13 shows the IPCE curve of the individual dyes 1 and 14, and the IPCE curve of a 1:1 mixture of these dyes.

The individual dyes are photo-active in different region of the solar spectrum. By using a mixture of the dyes, due to additive behaviour of the IPCE curves, a very broad range solar light can be harvested and converted to current.

10) Comparing Efficiency of the DSSC Prepared with Dye According to Present Invention, Namely Dye 1, and Another Organic Sensitizer 16 Both Harvesting Light in the Same Range of the Solar Spectrum The DSSCs were prepared by method described in Example 6 and measured according to Example 7b.

The DSSC efficiencies are in the same range of 5%. However, when one compares the structure of the dyes, it becomes clear that the dye according to present invention, namely dye 1, is much more easily synthesized than dye 16.

11) Efficiency of the DSSC by Using Dye 9 and 2 as Sensitizer

Figures 18, 18A, 18B:
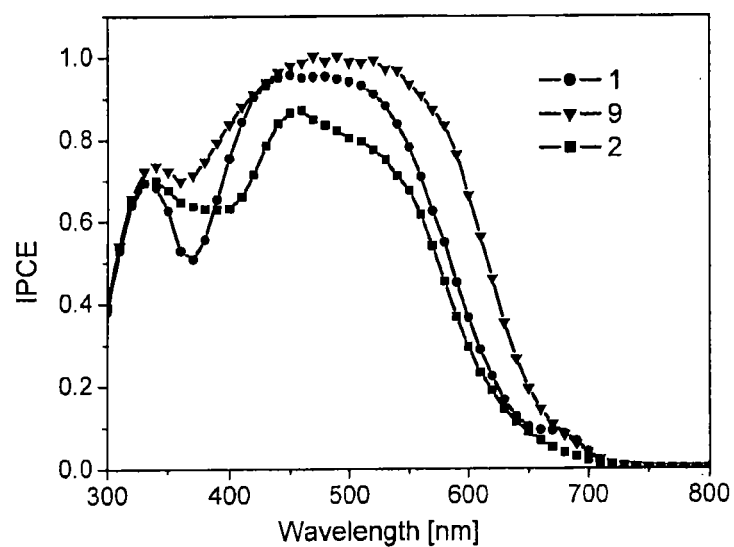
Figure 21:
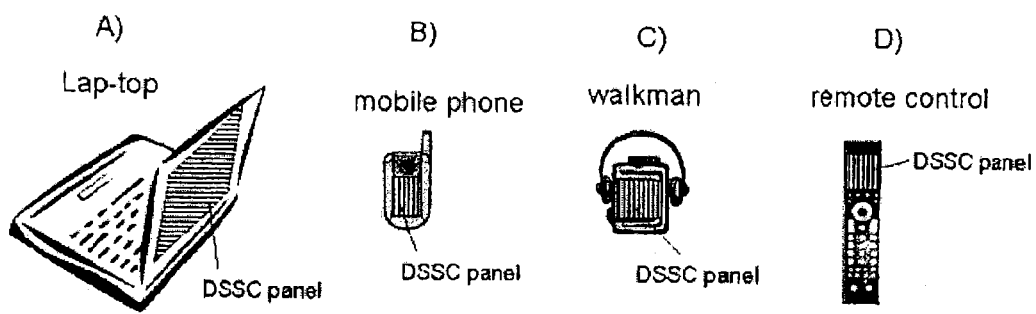
FIG. 21 shows various embodiments of electronic devices in accordance with the present invention wherein energy supply devices, such as solar cell panels, preferably dye sensitized solar cell panels (DSSCs) have been incorporated.

The DSSCs were prepared by the method described in Example 6 and by using 25 μm TiO$_2$ layer and measured according to Example 7b. The efficiency and IPCE curve are shown in FIGS. 18a and 18b, respectively.

The IPCE curve reflects the photo-activity of the sensitizer dyes at different wavelengths (IPCE=incident photon to current efficiency). The highest achievable IPCE value is 1.0. Sensitizer dye 1, 9 and 2 show very high, of almost unity, and wide IPCE values.

12) Performance of Solar Cells Prepared with a Mixture of the Respective Dye and Standard Ruthenium Black Dye 15.

The solar cells were prepared by method described in Example 6 and measured according to Example 7b. For comparison also DSSC prepared with the respective single sensitizer dye 15 was prepared and measured. The efficiency is shown in FIG. 19. As can be seen, the efficiencies by using a mixture of dyes for sensitization are much higher than that using only a single dye as sensitizer.

13) Performance of Solar Cells Prepared with a Mixture of the Respective Dye and Organic Dye 14.

The solar cells were prepared by method described in Example 6 and measured according to Example 7b. For comparison also DSSC prepared with the respective single sensitizer dye 14 was prepared and measured.
 a) by using 26 μm TiO$_2$ layers as electrode; the efficiency is shown in FIG. 20a.
 b) by using 10 μm TiO$_2$ layers as electrode; the efficiency is shown in FIG. 20b.

The efficiencies on thinner layer are slightly lower than on thick TiO2 layer, but, contrary to Ruthenium based sensitizers, still high enough to show the good performance of the dyes. This is attributed to the strong light absorption property of the dyes according to claim 1-12. In both cases, thin or thick TiO2 layers, the efficiency is increased by using a mixture of dyes for sensitization compared to that using a single dye.

The present invention provides for new sensitizer dyes which are useful for being employed in solar cells as well as in photocatalytic applications. They readily adsorb to nanoporous semiconductor layers and are easily manufactured. The use of an acyloin group as anchoring group for chromophores in such applications, to the best knowledge of the present inventors, has never been reported before.

The features of the present invention disclosed in the specification, the claims and/or in the accompanying drawings, may, both separately, and in any combination thereof, be material for realizing the invention in various forms thereof.

The invention claimed is:

1. An electric device, comprising a dye and a photoactive semiconductor porous material, wherein the dye comprising a chromophore to which an acyloin group is attached, and represented by formula (2e)

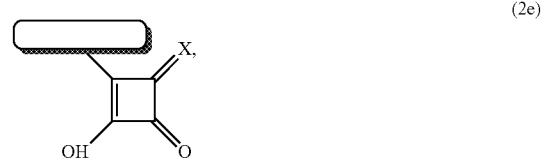

wherein said chromophore absorbs electromagnetic radiation in a range from 300-1200 nm and is

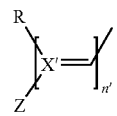

wherein X' is C,

Z is one or more moieties which, at each occurrence, is independently selected from the group consisting of H, a cyclic alkyl, an acyclic alkyl, a straight or branched chain moiety of formula —(CH$_2$)$_{n1}$—R, —[(CR═CR)$_{n1}$—(CH$_2$)$_{n2}$]$_p$—R, —[(C═C)$_{n1}$—(CH$_2$)$_{n2}$]$_p$—R, —[(CH$_2$)$_{n1}$—X$_{n2}$]$_p$—R, a halogen, a substituted phenyl, an unsubstituted phenyl, a substituted biphenyl, an unsubstituted biphenyl, and an unsubstituted heteroaryl, n'$32$ 1, n1 and n2=0-12 and p=0-6, wherein X is CR$_2$, O, S or NR, wherein R is selected from the group consisting of H, a straight or branched alkyl chain of formula —C$_n$H$_{2n+1}$, —COOR$^1$, —OR$^1$, —SR$^1$, —NR$^1$$_2$, F, Cl, Br, I, CN, and CF$_3$;

wherein R$^1$ is H, a straight or branched alkyl chain of formula —C$_n$H$_{2n+1}$, a substituted or non-substituted phenyl or biphenyl or heteroaryl, and n=1-12.

* * * * *